(12) United States Patent
Liaw

(10) Patent No.: US 9,985,111 B2
(45) Date of Patent: May 29, 2018

(54) STRUCTURE AND METHOD FOR A FIELD EFFECT TRANSISTOR

(71) Applicant: Taiwan Semiconductor Manufacturing Company, Ltd., Hsin-Chu (TW)

(72) Inventor: Jhon Jhy Liaw, Hsinchu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days. days.

(21) Appl. No.: 15/180,212

(22) Filed: Jun. 13, 2016

(65) Prior Publication Data

US 2016/0293730 A1 Oct. 6, 2016

Related U.S. Application Data

(62) Division of application No. 13/523,506, filed on Jun. 14, 2012, now Pat. No. 9,368,596.

(51) Int. Cl.
| | |
|---|---|
| *H01L 21/336* | (2006.01) |
| *H01L 29/66* | (2006.01) |
| *H01L 29/78* | (2006.01) |
| *H01L 29/10* | (2006.01) |
| *H01L 21/8234* | (2006.01) |
| *H01L 21/762* | (2006.01) |
| *H01L 21/265* | (2006.01) |
| *H01L 29/06* | (2006.01) |
| *H01L 29/165* | (2006.01) |

(52) U.S. Cl.
CPC .. *H01L 29/66545* (2013.01); *H01L 21/26513* (2013.01); *H01L 21/76224* (2013.01); *H01L 21/823437* (2013.01); *H01L 21/823481* (2013.01); *H01L 29/0649* (2013.01); *H01L 29/1037* (2013.01); *H01L 29/6659* (2013.01); *H01L 29/66795* (2013.01); *H01L 29/7834* (2013.01); *H01L 29/7851* (2013.01); *H01L 29/165* (2013.01); *H01L 29/66636* (2013.01)

(58) Field of Classification Search
None
See application file for complete search history.

(56) References Cited

U.S. PATENT DOCUMENTS

| 8,835,278 B2* | 9/2014 | Kar | H01L 21/76208 438/404 |
|---|---|---|---|
| 2007/0004113 A1* | 1/2007 | King | H01L 21/845 438/197 |
| 2007/0063261 A1* | 3/2007 | Chen | H01L 29/665 257/316 |
| 2007/0069293 A1* | 3/2007 | Kavalieros | H01L 21/823431 257/350 |

(Continued)

*Primary Examiner* — Sitaramarao S Yechuri
(74) *Attorney, Agent, or Firm* — Haynes and Boone, LLP

(57) ABSTRACT

A method of forming a semiconductor structure includes forming a shallow trench isolation (STI) feature in a semiconductor substrate. An active region is defined on the semiconductor substrate, wherein the STI feature and the active region have a coplanar surface. A dummy gate is formed on the active region and the STI feature, and an interlayer dielectric layer (ILD) is formed on the semiconductor substrate. The dummy gate is then removed, thereby forming a gate trench in the ILD. The STI feature is selectively etched within the gate trench. A metal gate is formed within the gate trench.

20 Claims, 6 Drawing Sheets

(56) References Cited

U.S. PATENT DOCUMENTS

| | | | |
|---|---|---|---|
| 2007/0278576 A1* | 12/2007 | Kim | H01L 29/66621 257/347 |
| 2008/0099834 A1* | 5/2008 | Willer | H01L 21/823431 257/330 |
| 2008/0299734 A1* | 12/2008 | Lee | H01L 29/66818 438/300 |
| 2009/0085089 A1* | 4/2009 | Chang | H01L 21/28273 257/316 |
| 2010/0163842 A1* | 7/2010 | Lai | H01L 29/785 257/19 |
| 2010/0163970 A1* | 7/2010 | Rakshit | H01L 29/785 257/327 |
| 2010/0230757 A1* | 9/2010 | Chen | H01L 21/76232 257/368 |
| 2011/0068399 A1* | 3/2011 | Bryant | H01L 21/84 257/347 |

\* cited by examiner

STRUCTURE AND METHOD FOR A FIELD EFFECT TRANSISTOR

This is a divisional of U.S. Ser. No. 13/523,506 filed Jun. 14, 2012, the entirety of which is hereby incorporated by reference.

BACKGROUND

Integrated circuits have progressed to advanced technologies with high packing densities and smaller feature sizes, such as 45 nm, 32 nm, 28 nm and 20 nm. In these advanced technologies, a planar field effect (or two dimensional) transistor has a channel configured in a top surface with a limited channel width. Thus, the capacitive coupling between the gate electrode and the channel is limited as well. When the feature size is reduced, the channel width cannot be reduced proportionally to retain or enhance the device performance. Accordingly, the transistor occupies more circuit area and the packing density is higher. There are trade off between the device performance and the packing density. Therefore, there is a need of a transistor structure and a method making the structure to address the above concerns.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
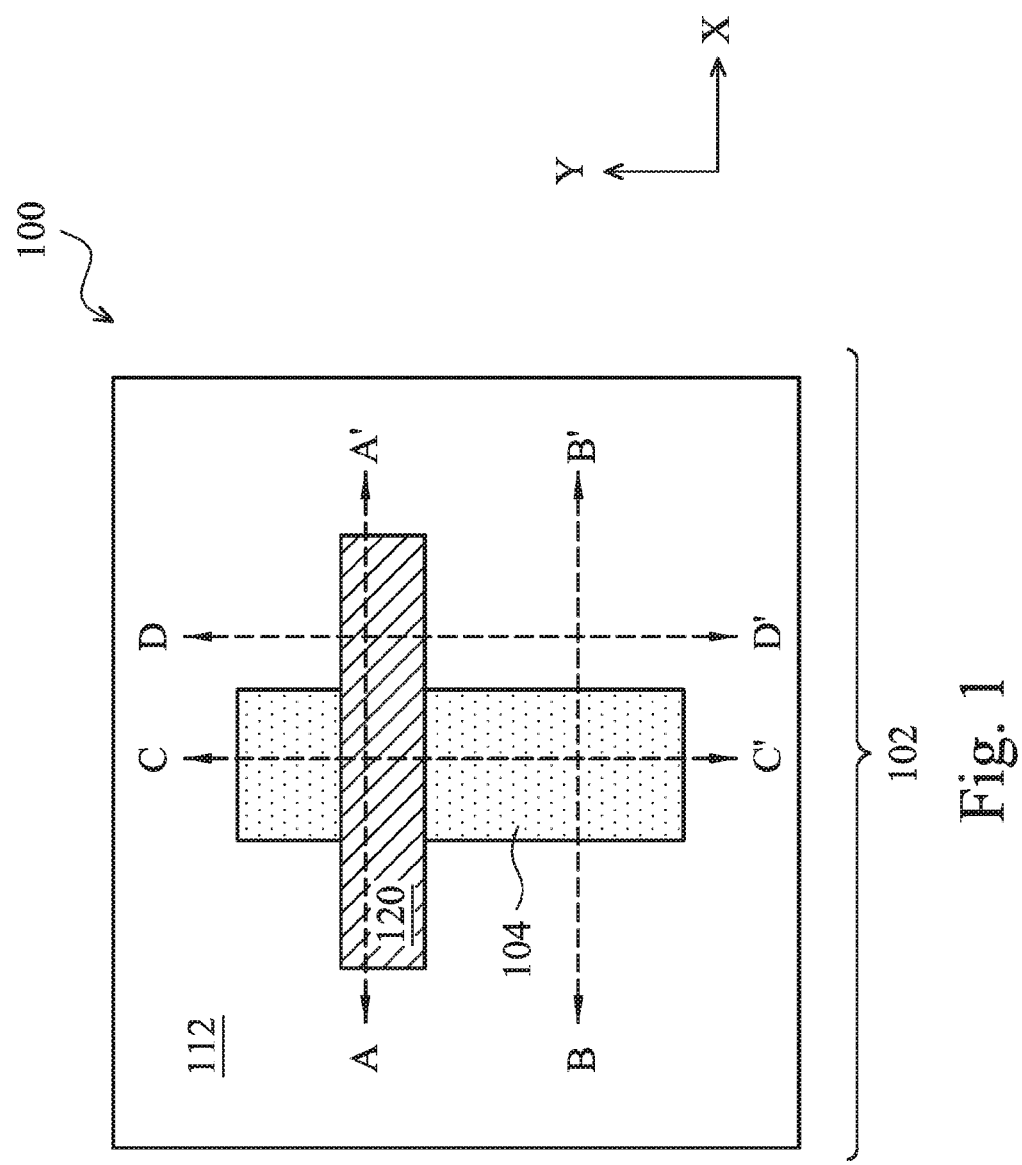
FIG. 1 is a top view of a semiconductor structure having an active region and recessed isolation feature constructed according to aspects of the present disclosure in one or more embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
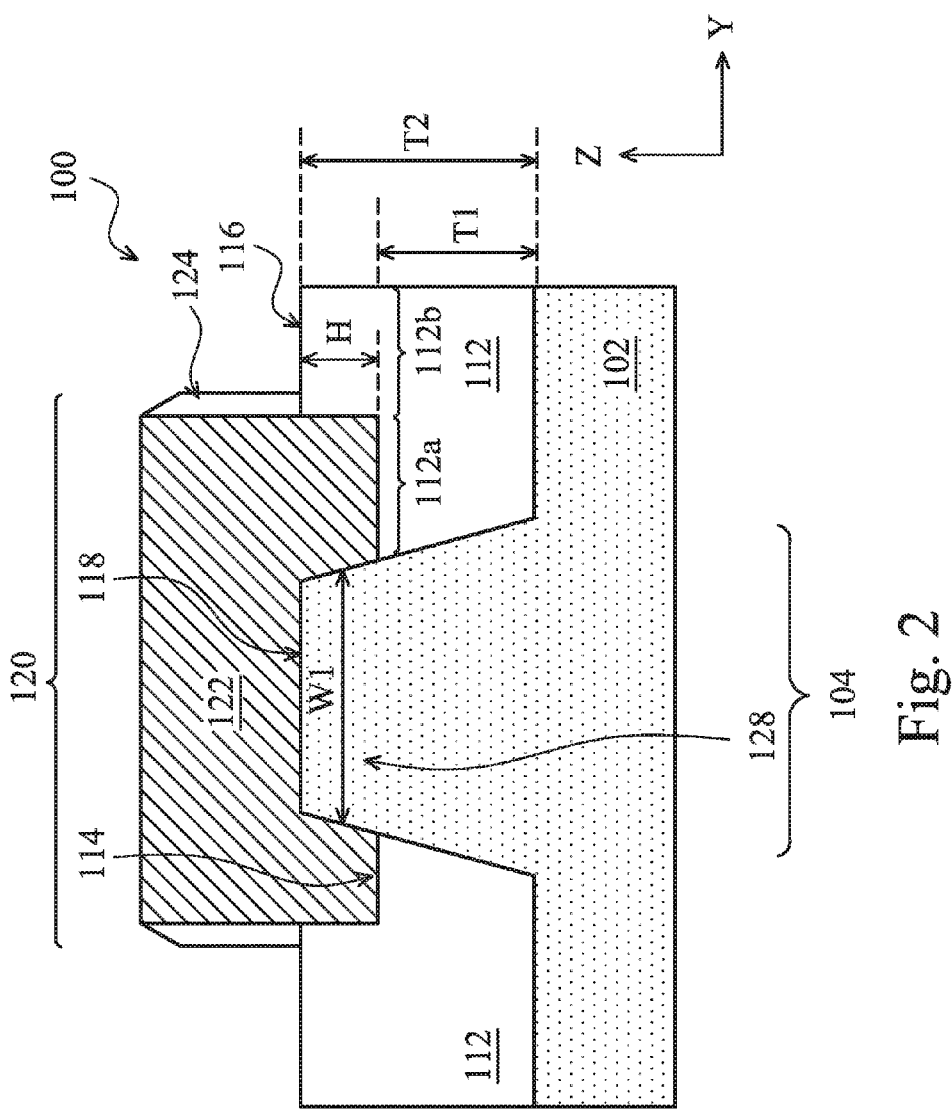
FIGS. 2-5 are sectional views of the semiconductor structure of FIG. 1 constructed according to aspects of the present disclosure in one or more embodiments.
Figure 3:
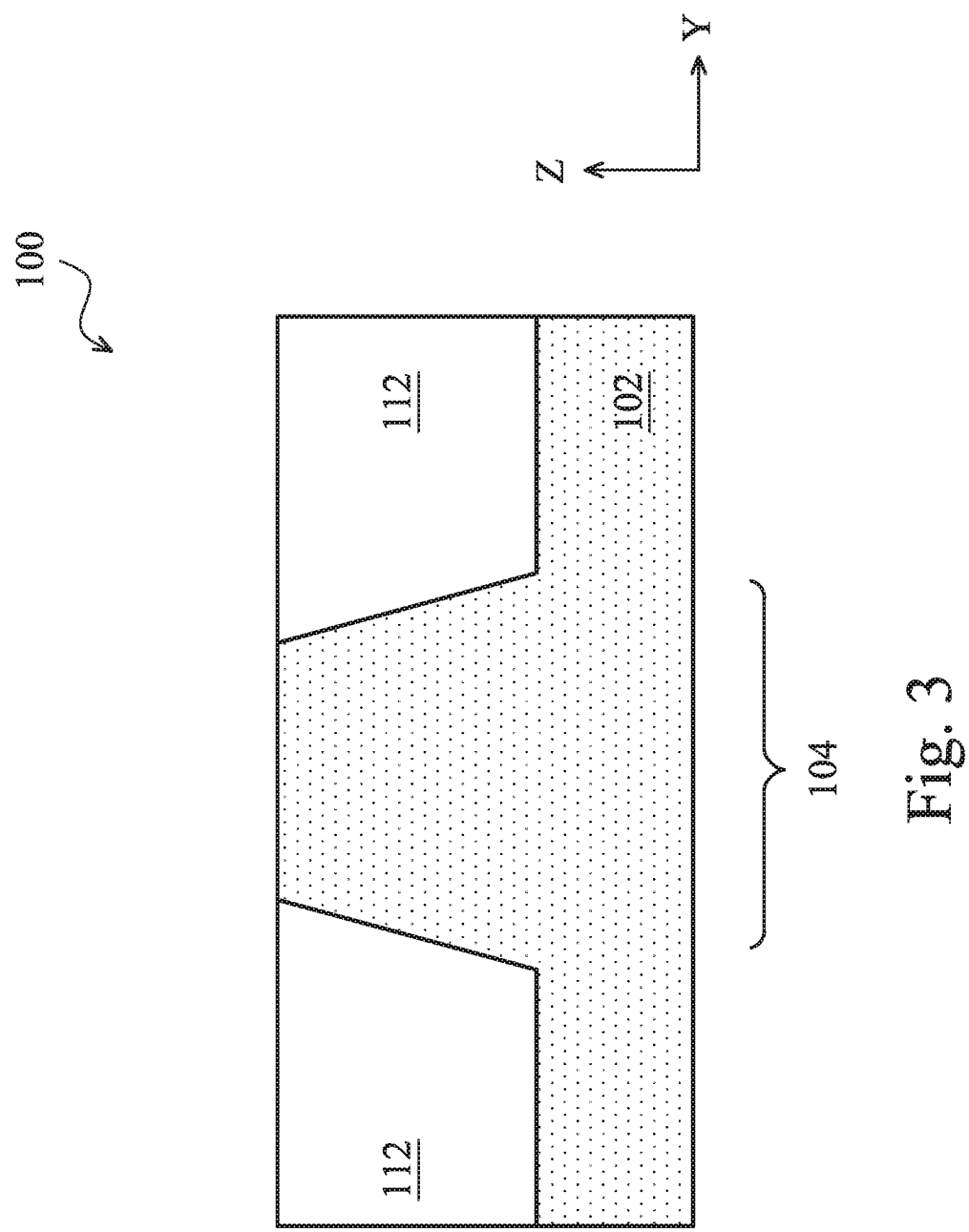
Figure 4:
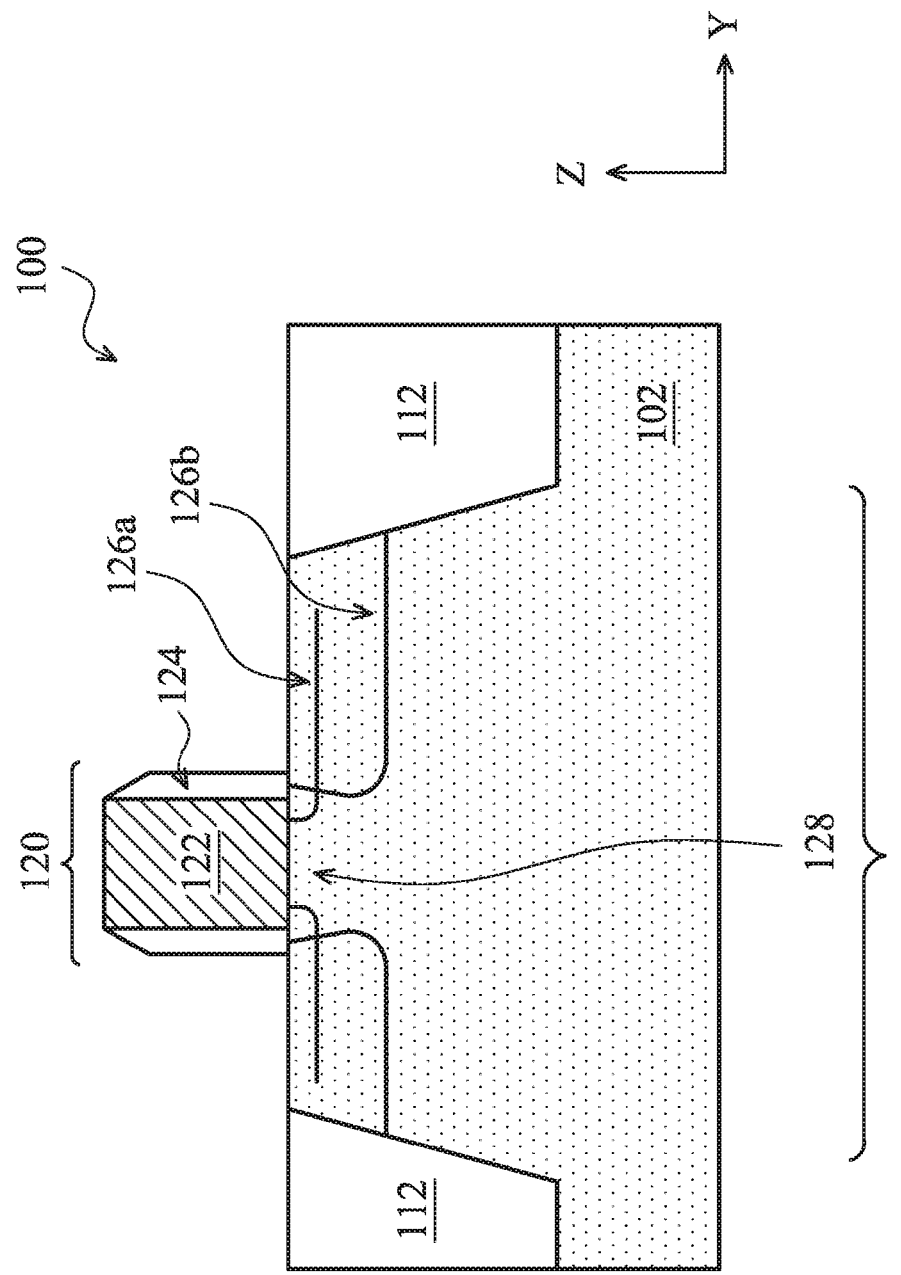
Figure 5:
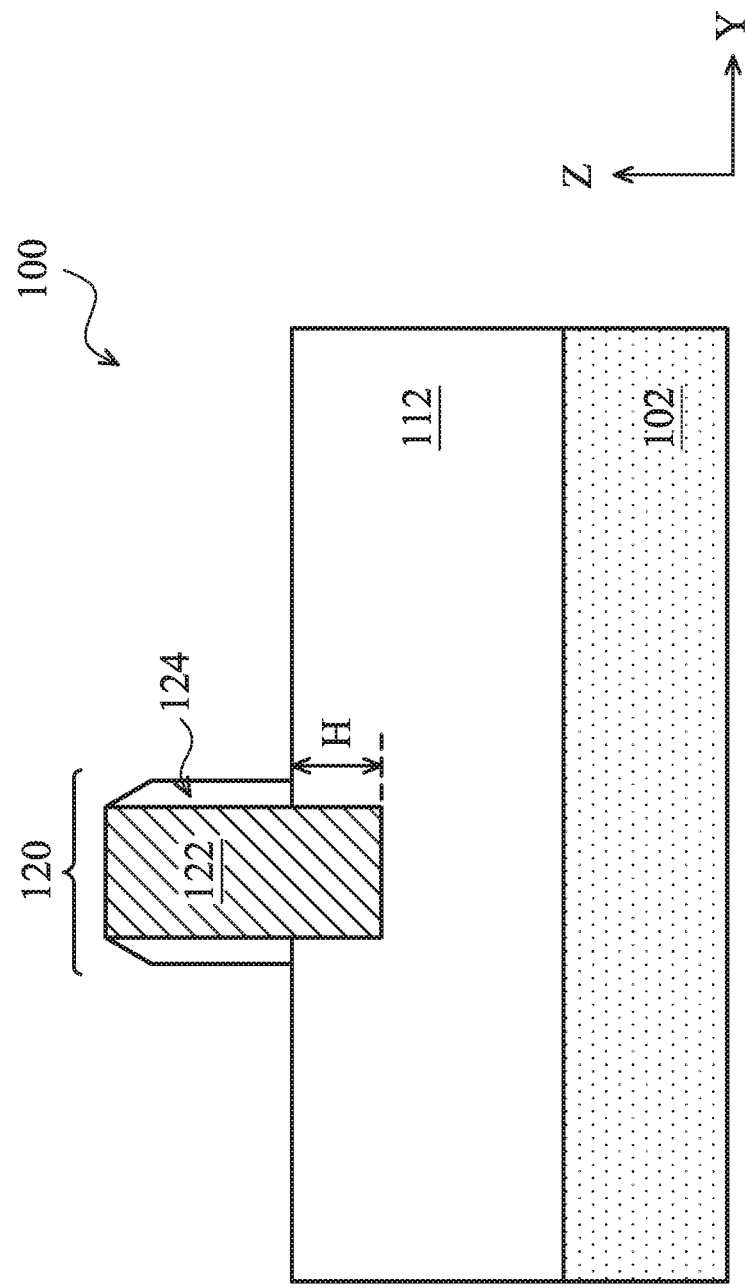

FIG. 1 is a top view of a semiconductor structure 100 having an active region and recessed isolation feature. FIGS. 2-5 are sectional views of the semiconductor structure 100. Specifically, FIG. 2 is a sectional view taken from a sectional line AA', FIG. 3 is a sectional view taken from a sectional line BB', FIG. 4 is a sectional view taken from a sectional line CC', and FIG. 5 is a sectional view taken from a sectional line DD'. The semiconductor structure 100 and the method making the same are described with reference to FIGS. 1 through 5.

The semiconductor structure 100 includes a substrate 102. The substrate 102 includes silicon. Alternatively, the substrate 102 includes germanium, silicon germanium or other proper semiconductor materials. The substrate 102 also includes various doped regions. In one embodiment, the substrate 102 includes an epitaxy (or epi) semiconductor layer. In another embodiment, the substrate 102 includes a buried dielectric material layer for isolation formed by a proper technology, such as a technology referred to as separation by implanted oxygen (SIMOX).

The semiconductor structure 100 includes one or more active regions 104 formed on the substrate 102. The active regions 104 are areas of the semiconductor substrate 102 for various devices, such as field effect transistor to be formed thereon. In the present embodiment, the semiconductor structure 100 includes one or more field effect transistor (FET) formed in the active region 104.

The active regions 104 are portion of the semiconductor substrate 102 and include silicon or other suitable semiconductor material, such as silicon germanium. The active regions 104 includes a semiconductor material same to the semiconductor material of the substrate 102. In an alternative embodiment, the active regions 104 includes areas for source and drain that have a semiconductor material different from the semiconductor material of the substrate 102, formed by a suitable technique such as epitaxy growth. For example, the substrate 102 includes silicon and the source and drain areas include silicon germanium, silicon carbide or both in a proper configuration. In one embodiment, a doped well, such as n-type well or p-type well, is formed in the active region 104. In one example, the active region 104 includes a n-type well for one or more p-type field effect transistor to be formed therein. In another example, the active region 104 includes a p-type well for one or more n-type field effect transistor to be formed therein.

In one embodiment, the active region has an elongated shape spanned in a first direction (X axis or X direction) having a short dimension and in a second direction (Y axis or Y direction) having a long dimension. The first direction is orthogonal to the second direction, as illustrated in FIG. 1. The X axis and Y axis define a substrate plane. Z axis or Z direction is also defined as a direction perpendicular to both X and Y directions or orthogonal to the substrate plane.

The semiconductor structure 100 includes one (or more) shallow trench isolation (STI) feature 112 formed in the substrate to define various active regions 104 and isolate the active regions from each other. The STI feature 112 includes one or more dielectric material, such as silicon oxide, silicon nitride, silicon oxynitride, other suitable dielectric material, or combinations. In one embodiment, the formation of the STI feature 112 includes etching a trench in the semiconductor substrate 102 and filling the trench with dielectric materials. The filled trench may have a multi-layer structure such as a thermal oxide liner layer with silicon nitride filling the trench. In another embodiment, the STI feature may be created using a process sequence such as: growing a pad oxide, forming a low pressure chemical vapor deposition (LPCVD) silicon nitride layer, patterning the silicon nitride layer and the pad oxide layer to form a hard mask by a lithography process and etch, etching a trench in the substrate, optionally growing a thermal oxide trench liner to improve the trench interface, filling the trench with oxide, using chemical mechanical planarization (CMP) to etch back, and using nitride etch to remove the nitride layer.

The active region 104 is bordered by the STI feature 112. In one embodiment, the STI feature 112 is surrounding the active region 104. Particularly, as illustrated in FIG. 2, the STI feature 112 includes a first portion 112a in a first region and a second portion 112b in the second region. The first portion 112a is recessed relative to the second portion 112b by a selective etch process applied to a gate trench. The gate trench is formed in a gate replacement procedure, which will be further described later. The first portion 112a of the STI feature 112 has a first top surface 114 and the second portion 112b of the STI feature 112 has a second top surface 116 higher than the first top surface. The active region 104 has a third top surface 118 that is coplanar with the second top surface 116. The first top surface 114 is lower than the second top surface 116 by a dimension H. In one embodiment, the dimension H ranges between about 10 nm and about 40 nm.

As illustrated in FIG. 2, the first portion 112a of the STI feature in the first region has a first thickness T1 and the second portion 112b of the STI feature in the second region has a second thickness T2. The second thickness T2 is greater than the first thickness T1. Furthermore, the first top surface 114 of the first portion 112a of the STI feature is below the top surface 116 of the second portion of the STI feature by a distance H=T2−T1.

The semiconductor structure 100 includes a gate 120 formed on the active region 104 and extended onto the STI feature 112. Especially, the gate 120 extends to the first portion 112a of the STI feature 112. The gate 120 includes a gate dielectric layer and a gate electrode on the gate dielectric layer. The gate dielectric layer and gate electrode are collectively referred to as gate stack 122. As illustrated in FIG. 2, the gate stack 122 includes a first portion on the active region 104 and a second portion extended onto the first portion 112a of the STI feature. The first portion of the gate stack 120 includes a first bottom surface disposed on the third top surface 118 of the active region 104 and a second bottom surface disposed on the first top surface 114 of the STI feature 112. The second bottom surface of the gate stack 122 is lower than the first bottom surface of the gate stack 122 by the distance H.

Especially, the second portion of the gate stack 122 on the STI feature 112 is aligned with the first portion 112a of the STI features. In the top view, the second portion of the gate stack 122 matches with the first portion 112a of the STI feature. State differently, the second portion of the gate stack 122 has a shape and a size same as the shape and size of the first portion 112a of the STI feature. Furthermore, the respective edges of the second portion of the gate stack 122 and the first portion 112a of the STI feature overlap and match with each other. In the present embodiment, this is so because the gate stack 122 is formed by a procedure that includes forming a dummy gate stack, forming an interlayer dielectric (ILD) layer, performing a CMP process, etching the dummy gate stack to form a gate trench in the ILD layer, selectively etching to recess the first portion of the STI feature exposed within the gate trench, and then forming the metal gate by deposition and polishing.

As illustrated in FIG. 3, the second portion 112b of the STI feature 112 and the active region 104 have a coplanar top surface. Specifically, the STI feature 112 except for the portion underlying the gate stack 122 is coplanar with the active region 104 at the top surface.

In one embodiment, the gate 120 has an elongated shape oriented in the first direction (X direction). The gate 120 includes a first dimension spanning in the first direction and a second dimension spanning in a second direction (Y direction). The first dimension of the gate 120 is greater than the second dimension of the gate 120.

The gate dielectric layer includes high k dielectric layer having a dielectric constant greater than the dielectric constant of the thermal silicon oxide. In various embodiment, the high k dielectric layer includes silicon nitride, silicon carbide, silicon oxynitride, hafnium oxide, lutetium (Lu) oxide, aluminum oxide, zirconium oxide, tantalum oxide, titanium oxide, strontium (Sr) oxide, or combinations thereof. The high k dielectric layer is formed by a suitable technique, such as atomic layer deposition (ALD). In another embodiment, the gate dielectric layer includes an interfacial layer (IL), such as thermal silicon oxide formed on the active region 104 and the high k dielectric layer.

The gate electrode includes a conductive material, such as doped polysilicon, metal, metal alloy, silicide or combinations thereof. In various example, the gate electrode includes aluminum, aluminum copper, copper, titanium nitride, titanium tungsten, tantalum nitride, gold (Au), silver (Ag), silicide, refractory metal, or combinations thereof. The conductive material is formed by a suitable technique, such as chemical vapor deposition (CVD), physical vapor deposition (PVD), plating or combinations thereof.

In various embodiments, the gate stack includes different combinations of the gate electrode and dielectric layer, such as polysilicon and silicon oxynitride; metal and high k dielectric material; aluminum and refractory metal and high k dielectric material; silicide and high k dielectric material, or combinations thereof.

The gate stack 122 is formed by deposition and patterning that further includes a lithography process and etch. For example, gate dielectric layer and gate electrode material deposited, a hard mask is deposited and patterned by lithography process and etch; and then patterning the gate materials by etching through the openings of the hard mask.

The gate 120 also includes a gate spacer 124 formed on the sidewalls of the gate stack and disposed on the second portion 112b of the STI feature 112 in the second region. The gate spacer 124 includes one or more dielectric material, such as silicon oxide, silicon nitride, silicon carbide, silicon oxynitride, high k dielectric material with a dielectric constant greater than about 5, or a combination thereof. The gate spacer 124 is formed by deposition and anisotropic etch, such as dry etch. The gate spacer 124 is formed on the second portion 112b of the STI feature 112 and aligned with the edge of the second portion 112b of the STI feature 112. Particularly, the edge between the portion 112a and the second portion 112b of the STI feature 112 is aligned with the edge between the gate stack 122 and the gate spacer 124 in the top view. As illustrated in FIG. 2, the gate spacer 124 includes a third bottom surface disposed on the second top surface 116 of the second portion 112b of the STI feature. The third bottom surface of the gate spacer 124 is coplanar with the first bottom surface of the gate stack 122 within the active region 104 and is higher than the second bottom surface of the gate stack 122 within the first portion 112a of the STI feature 112 by the dimension H.

The formation of the gate spacer 124 is incorporated in the procedure to form the gate stack 122. In one embodiment, the dummy gate stack is formed and the gate spacer 124 is formed on the sidewalls of the dummy gate stack. After the dummy gate stack is removed by etching to recess the first portion 112a of the STI feature 112 exposed within the gate trench, the gate spacer 124 remains on the second portion 112b of the STI feature 112.

As illustrated in FIG. 5, a portion of the gate stack 122 disposed on the STI feature 112 is partially embedded in the STI feature 112 by a depth H. The gate spacer 124 is not embedded in the STI feature 112 but is disposed on the top surface of the STI feature 112.

As illustrated in FIG. 4, the semiconductor structure 100 also includes source and drain features 126 are formed on the active region 104. The source and drain features 126 are spaced away in the second direction (Y direction) and are configured on opposite sides of the gate stack 122. In one embodiment, the source and drain features 126 include light doped drain (LDD) features 126a aligned with the sides of the gate stack 122 and also includes heavily doped source and drain (S/D) 126b formed after the gate spacer 124 and are aligned with the outer edges of the gate spacer 124. Various source and drain features are formed by ion implantations with proper doping species, such as n-type dopant or p-type dopant, and additionally with an annealing process for activation. In one example, the n-type dopant includes phosphoric. In another embodiment, the p-type dopant includes boron.

In another embodiment, the source drain features 126 are formed on an epitaxy grown semiconductor that includes a semiconductor material different from the semiconductor material of the semiconductor substrate 102 for enhanced carrier mobility and improved device performance. In one embodiment, the epitaxy grown semiconductor material is formed by a procedure that includes etching to recess the source and drain regions of the active region and then epitaxy growth with a semiconductor material. In another embodiment, the epitaxy grown semiconductor material includes silicon germanium (SiGe), silicon germanium carbide (SiGeC), germanium (Ge), silicon or a combination thereof, for a p-type FET. In yet another embodiment, the epitaxy grown semiconductor material includes silicon phosphoric (SiP), silicon carbide (SiC), silicon phosphoric carbide (SiPC), silicon or a combination thereof, for a n-type FET.

The semiconductor structure 100 also includes a channel (or channel region) 128 formed in the active region and spanned between the source and drain features 126, as illustrated in FIG. 4. The channel spans in the second direction (Y direction) from the source to drain to a first dimension as channel length (as illustrated in FIG. 4) and spans in the first direction (X direction) into a second dimension as channel width (as illustrated in FIG. 2).

Still referring to FIG. 2 for the channel width, the channel 128 includes various active surfaces in contact with gate stack 122 (specifically gate dielectric layer). More specifically, the channel 128 includes a top portion and two sidewall portions. The top portion of the channel 128 spans between the two side portions with a first width W1. The two sidewall portions each span with a second width that is about equal to the depth H of the respective sidewalls. The total width of the channel 128 enlarged from W1 to W that is equal to or greater than W1+2H. The coupling between the gate electrode and the channel is increased.

In the present embodiment, the top portion of the channel has a width W1 greater than the width H of each sidewall portion of the channel. In one example, the width W1 of the top portion of the channel 128 is greater than about 50 nm and the width H of the sidewall portion of the channel 128 is less than about 40 nm. In one embodiment, the sidewall width H ranges between about 10 nm and about 40 nm. In another embodiment, the top surface width W1 ranges between about 50 nm and about 120 nm for a n-type FET. In yet another embodiment, the top surface width W1 ranges between about 35 nm and about 60 nm for a p-type FET. The channel 128 may be formed by one or more ion implantation tuned for various consideration such as threshold voltage and/or anti-punch through (APT).

In the present embodiment, the channel 128, source and drain features 126, and the gate 120 are configured to form a field effect transistor, such a n-type FET or p-type FET. The device performance of the FET is enhanced by the enlarged channel width.

In another embodiment, the semiconductor structure 100 includes a plurality active regions 104 separated by a plurality of STI features 112. Each active region and the respective STI features have a similar configuration described above. For example, the STI feature includes a first portion and a second portion. The first portion is recessed from the second portion. The channel includes a top portion and opposing sidewall portions. Various n-type FETs and p-type FETs are formed in those active regions. Those n-type FETs and p-type FETs are configured to form a static random access memory (SRAM) cell. In a particular embodiment, the SRAM cell includes two cross-coupled two inverters for data storage and pass gates. In furtherance of the embodiment for the SRAM cells, each inverter includes a pull up device having one or more p-type FET and a pull down device having one or more n-type FET. The pass gates include n-type FETs. In another embodiment, the semiconductor structure 100 includes a plurality of SRAM cells configured in n array.

Figure 6:
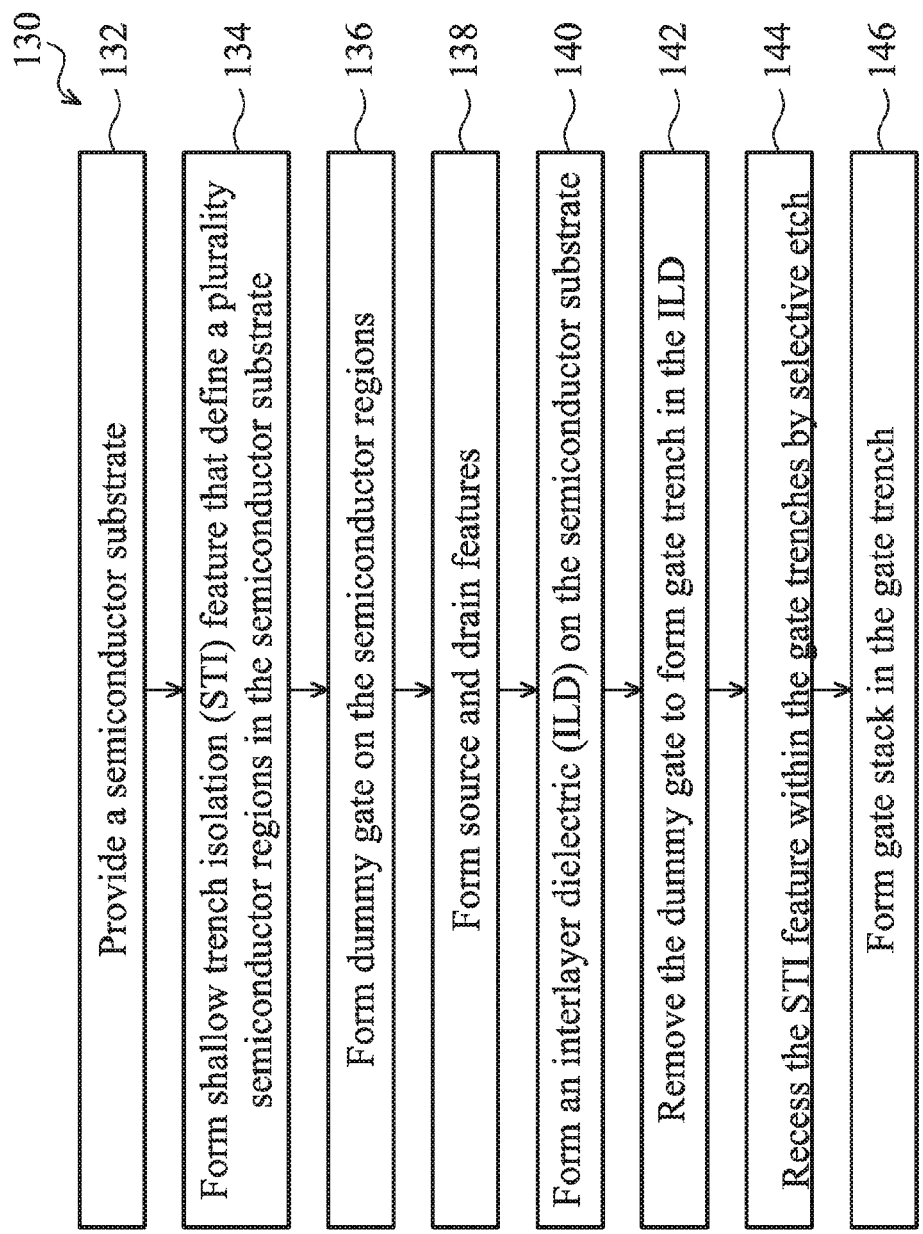
FIG. 6 is a flowchart of a method making a semiconductor structure of FIG. 1 constructed according to various aspects of the present disclosure in one embodiment.

FIG. 6 is a flowchart of a method 130 making the semiconductor structure 100 constructed according to various aspects of the present disclosure in one or more embodiment. The method 130 is described with reference to FIGS. 1 through 6. The method 130 starts at 132 from a semiconductor substrate 102.

The method 130 includes an operation 134 to form one or more STI features 112 that defines various active regions 104. In one embodiment, the formation of the STI feature 112 includes etching a trench in the semiconductor substrate 102 and filling the trench with dielectric materials. The filled trench may have a multi-layer structure such as a thermal oxide liner layer with silicon nitride filling the trench. In another embodiment, the STI feature may be created using a process sequence such as: growing a pad oxide, forming a low pressure chemical vapor deposition (LPCVD) silicon nitride layer, patterning the silicon nitride layer and the pad oxide layer to form a hard mask by a lithography process and etch, etching a trench in the substrate, optionally growing a thermal oxide trench liner to improve the trench interface, filling the trench with oxide, using CMP process to etch the excessive dielectric material and planarize the surface, and using nitride etch to remove the nitride layer.

The method 130 may include other operations, such as form one or more doped wells (p-well and n-well for example) in the active regions 104 by ion implantations.

The method 130 includes an operation 136 to form one or more dummy gate on the semiconductor substrate 102. The dummy gate includes dummy gate stack and gate spacers. The formation of the dummy gate includes forming dummy gate material layers including a dielectric material layer and a polysilicon layer on the dielectric material layer and patterning the dummy gate material layers by lithography process and etching. The patterned dummy gate is disposed on the active region 104 and extended in the first direction (X direction) to the STI feature 112. The gate spacer 124 is formed by dielectric deposition and etch, such as dry etch.

The method 130 also includes an operation 138 to form source and drain features 126 are formed on the active region 104. The source and drain features 126 are spaced away in the second direction (Y direction) and are configured on opposite sides of the gate stack 122. In one embodiment, the source and drain features 126 include light doped drain (LDD) features 126a aligned with the sides of the gate stack 122 and also includes heavily doped source and drain (S/D) 126b formed after the gate spacer 124 and are aligned with the outer edges of the gate spacer 124. Various source and drain features are formed by ion implantations with proper doping species, such as n-type dopant or p-type dopant. An annealing process may follow for activation. In one example, the n-type dopant includes phosphoric. In another example, the p-type dopant includes boron. In another embodiment, the source and drain features 126 include epitaxy grown semiconductor material. In this case, the semiconductor substrate in the source and drain regions are recessed by an etch process, a semiconductor material is epitaxy grown in the recessed areas. The ion implantations are implemented afterward.

The source drain features 126 formed on an epitaxy grown semiconductor that includes a semiconductor material different from the semiconductor material of the semiconductor substrate 102 for enhanced carrier mobility and improved device performance. In one embodiment, the epitaxy grown semiconductor material includes silicon germanium (SiGe), silicon germanium carbide (SiGeC), germanium (Ge), or a combination thereof, for a p-type FET. In yet another embodiment, the epitaxy grown semiconductor material includes silicon phosphoric (SiP), silicon carbide (SiC), silicon phosphoric carbide (SiPC), or a combination thereof, for a n-type FET.

The method 130 includes an operation 140 by forming an ILD layer on the semiconductor substrate 102 and the dummy gate. The ILD layer is formed by a procedure including deposition and CMP. The CMP process remove the ILD deposited on the dummy gate and planarize the surface. The ILD layer includes silicon oxide, low k dielectric material, other suitable dielectric material or combination thereof. The deposition may includes CVD or spin-on coating and curing.

The method 130 includes an operation 142 to remove the dummy gate, forming a gate trench in the ILD layer. An etch process is applied to remove the dummy gate stack while the gate spacer 124 remains. Therefore, the gate spacer 124 remains and is exposed as sidewalls of the gate trench. The etch process may include multiple etch steps tuned to remove respective dummy gate material layers. In one embodiment, only the conductive material layer is removed from the dummy gate by the etch process. In another embodiment, both the conductive material layer and the dielectric material layer in the dummy gate are removed by the etch process. The active region 104 and the STI feature 112 within the gate trench are exposed.

The method 130 includes an operation 144 by recessing the STI feature 112 exposed within the gate trench by an etch process tuned to selectively remove the dielectric material of the STI feature 112 while the semiconductor material of the substrate 102 substantially remains. Thus, the first portion 112a of the STI feature 112 is recessed and is automatically aligned with the gate trench (therefore aligned with the metal gate to be formed). In one example, the STI feature 112 includes silicon oxide, the etch process uses a wet etch with a hydrofluoric acid (HF) solution.

The channel 128 is defined in the active region between the source and drain features 126. The method 130 may include other doping process to tune the channel for threshold voltage or other factors. Particularly, as illustrated in FIG. 2, the channel 128 includes various active surfaces in contact with gate stack 122 (specifically gate dielectric layer). More specifically, the channel 128 includes a top portion and two sidewall portions. The top portion of the channel 128 spans between the two side portions with a first width W1. The two sidewall portions each span with a second width that is about equal to the depth H of the respective sidewalls. The total width of the channel 128 enlarged from W1 to W that is equal to or greater than W1+2H. The coupling between the gate electrode and the channel is increased.

In the present embodiment, the top portion of the channel has a width W1 greater than the width H of each sidewall portion of the channel. In one example, the width W1 of the top portion of the channel 128 is greater than about 50 nm and the width H of the sidewall portion of the channel 128 is less than about 40 nm. In one embodiment, the sidewall width H ranges between about 10 nm and about 40 nm. In another embodiment, the top surface width W1 ranges between about 50 nm and about 120 nm for a n-type FET. In yet another embodiment, the top surface width W1 ranges between about 35 nm and about 60 nm for a p-type FET. The channel 128 may be formed by one or more ion implantation tuned for various consideration such as threshold voltage and/or anti-punch through (APT).

The method 130 includes an operation 146 to form the gate stack 122 that includes deposition and CMP. In one embodiment where only the conductive material in the dummy gate stack is removed, the deposition only deposits the conductive material. In another embodiment where both the conductive material and the dielectric material in the dummy gate stack are removed. The deposition deposits both high k dielectric layer and the metal electrode layer. The CMP process removes the excessive gate material deposited on the ILD layer and planarize the surface. In yet another embodiment, the gate stack for n-type FET and the gate stack for p-type FET include respective conductive material tuned to have proper respective work functions (referred to as work function metals), the gate material layer are respectively deposited in the respective gate trenches.

Thus formed gate stack 122 includes gate dielectric layer and conductive material layer. The gate dielectric layer includes high k dielectric layer. In various embodiment, the high k dielectric layer includes silicon nitride, silicon carbide, silicon oxynitride, hafnium oxide, lutetium (Lu) oxide, aluminum oxide, zirconium oxide, tantalum oxide, titanium oxide, strontium (Sr) oxide, or combinations thereof. The high k dielectric layer is formed by a suitable technique, such as atomic layer deposition (ALD). In another embodiment, the gate dielectric layer includes an interfacial layer (such as thermal silicon oxide) and the high k dielectric layer.

The gate electrode includes a conductive material, such as doped polysilicon, metal, metal alloy, silicide or combinations thereof. In various example, the gate electrode includes aluminum, aluminum copper, copper, titanium nitride, titanium tungsten, tantalum nitride, gold (Au), silver (Ag), silicide, refractory metal, or combinations thereof. The conductive material is formed by a suitable technique, such as chemical vapor deposition (CVD), physical vapor deposition (PVD), plating or combinations thereof.

In various embodiments, the gate stack includes different combinations of the gate electrode and dielectric layer, such as polysilicon and silicon oxynitride; metal and high k dielectric material; aluminum and refractory metal and high k dielectric material; silicide and high k dielectric material, or combinations thereof.

In the present embodiment, the channel 128, source and drain features 126, and the gate 120 are configured to form a field effect transistor, such a n-type FET or p-type FET. The device performance of the FET is enhanced by the enlarged channel width.

Although various embodiments of the semiconductor structure and the method making the same are provided. Other fabrication operations may be implemented before, during or after the method 130. Other alternatives and additions may present without departure from the scope of the present disclosure. The present disclosure may be used in various applications. For example, the semiconductor structure 100 may be used to form static random access memory (SRAM) cells. In other examples, the semiconductor structure 100 may be incorporated in various integrated circuit, such as logic circuit, dynamic random access memory (DRAM), flash memory, or imaging sensor.

In one embodiment, various patterning process may utilize a patterned resist layer or a hard mask as an etch mask. The patterned resist layer is formed by a procedure including resist coating, soft baking, exposing, post-exposure baking (PEB), developing, and hard baking. The hard mask may be formed by deposition of a hard mask layer and then patterning the hard mask layer by a procedure including a lithography process and an etching process. More specifically, a patterned resist layer is formed on the hard mask layer. Then the hard mask layer is etched through the openings of the patterned photoresist layer, forming a patterned hard mask. The patterned resist layer is removed thereafter using a suitable process, such as wet stripping or plasma ashing. In one example, the etching process includes applying a dry (or plasma) etch to remove the hard mask layer within the openings of the patterned resist layer.

In another embodiment, a gate dielectric layer (such as silicon oxide and/or high k dielectric material layer) may be formed by other suitable technique, such as thermal oxidation, atomic layer deposition (ALD), metal organic chemical vapor deposition (MOCVD), physical vapor deposition (PVD), or molecular beam epitaxy (MBE). In one example, the gate dielectric layer includes silicon oxide formed by thermal oxidation applied to the semiconductor substrate 102 that include silicon. In another example, a high k dielectric material is incorporated in the gate dielectric and includes used and includes metal oxide, such as zirconium oxide (ZrO2), aluminum oxide (Al2O3), or hafnium oxide (HfO2). In yet another example, the high k dielectric material is formed by an UV-Ozone Oxidation that includes sputtering to form metal film; and in-situ oxidation of metal film by O2 in presence of ultra-violet (UV) light.

In another embodiment, the patterning of the dummy gate stack includes patterning the gate electrode layer (conductive layer) and the gate dielectric layer (dielectric layer). The patterning of the conductive layer and the dielectric layer includes one or more etch steps. In one example, a hard mask is formed on the conductive layer as an etch mask during the etch process. In another example, a patterned resist layer is used as an etch mask to pattern the conductive layer and the dielectric layer.

In another embodiment when the semiconductor structure 100 includes both n-type FETs (nFETs) and p-type FETs (pFETs), the source and drain regions are formed for the n-type FETs and the p-type FETs, respectively, using proper doping species. As one example for nFETs, the LDD features are formed by an ion implantation with a light doping dose. Thereafter, spacers are formed by dielectric deposition and anisotropic etch, such as plasma etch. Then the heavily doped S/D features are formed by an ion implantation with a heavy doping dose. The various source and drain features of the pFETs can be formed in a similar procedure but with opposite doping type. In one embodiment of the procedure to form various source and drain features for both nFETs and pFETs, the LDD features of nFETs are formed by an ion implantation while the regions of pFETs are covered by a patterned photoresist layer; the LDD features of pFETs are formed by an ion implantation while the regions of nFETs; then spacers are formed to nFET gate stacks and pFET gate stacks by deposition and etch. the S/D features of nFETs are formed by ion implantation while the regions of pFETs are covered by another patterned photoresist layer; and the S/D features of pFETs are formed by ion implantation while the regions of nFETs are covered by another patterned photoresist layer. In one embodiment, a high temperature annealing process is followed to activate the various doping species in the source and drain regions.

In another embodiment, various interconnection features are formed to couple various devices to form functional circuits. The interconnection features include vertical interconnects, such as contacts and vias, and horizontal interconnects, such as metal lines. The various interconnection features may use various conductive materials including copper, tungsten and silicide. In one example, a damascene process is used to form copper-based multilayer interconnection structure. In another embodiment, tungsten is used to form tungsten plug in the contact holes. In another example, silicide is used to form various contact on source and drain regions for reduced contact resistance.

In yet another embodiment, the semiconductor material for the channel 128 includes silicon or alternatively includes epitaxy grown semiconductor material selected from the group consisting of silicon germanium, silicon germanium carbide, germanium, III-V group semiconductor material, or combinations thereof.

Thus, the present disclosure provides one embodiment of a semiconductor structure that includes a semiconductor substrate; a shallow trench isolation (STI) feature formed in the semiconductor substrate, wherein the STI feature is a continuous isolation feature and includes a first portion in a first region and a second portion in a second region, and the first portion of the STI feature is recessed relative to the second portion of the STI feature; an active region in the semiconductor substrate and bordered by the STI feature; a gate stack disposed on the active region and extended in a first direction to the first region of the STI feature; source and drain features formed in the active region and interposed by the gate stack; and a channel formed in the active region and spanned in a second direction between the source and drain features, the second direction being different from the first direction. The channel includes a top portion having a width W in the first direction and two side portions each having a height H less than the width W.

In one embodiment of the semiconductor structure, the first portion of the STI feature has a first top surface; the second portion of the STI feature has a second top surface higher than the first top surface; and the active region of the semiconductor substrate has a third top surface being coplanar with the second top surface.

In another embodiment, the first portion of the STI feature has a first thickness; and the second portion of the STI feature has a second thickness greater than the first thickness.

In yet another embodiment, the gate stack has a sidewall aligned with an interface between the first portion and the second portion of the STI feature; and a gate spacer contacts the sidewall of the gate stack and is disposed directly on the second portion of the STI feature.

In another embodiment, a first portion of the gate stack in the active region has a first bottom surface; and the gate spacer surface has a second bottom surface being coplanar with the first bottom surface. In yet another embodiment, the gate spacer vertically contacts the second top surface of the second portion of the STI feature; and the gate stack vertically contacts the first top surface of the first portion of the STI feature. In yet another embodiment, a second portion of the gate stack has a third bottom surface being lower than the second bottom surface of the gate spacer.

In yet another embodiment, the gate stack includes a gate dielectric layer and a gate electrode that is disposed on the gate dielectric layer; and the gate electrode and the gate dielectric layer include respective conductive material and dielectric material selected from the group consisting of polysilicon and silicon oxynitride; metal and high k dielectric material; silicide and high k dielectric material; and combinations thereof.

In yet another embodiment, the extended portion of the gate stack matches to the first region of the STI feature in a top view.

The present disclosure also provides another embodiment of a semiconductor structure that includes a shallow trench isolation (STI) feature formed in a semiconductor substrate; an active region defined in the semiconductor substrate and surrounded by the STI feature, the STI feature and the active region have a coplanar top surface; a gate stack formed on the active region and extended to the STI feature, wherein the extended portion of gate stack is vertically extended below the top surface; and source and drain features formed in the active region and configured on two opposite sides of the gate stack.

In one embodiment of the semiconductor structure, a channel is formed in the active region and spanned between the source and drain features; and the source and drain features, gate stack and the channel are configured to form a field effect transistor.

In another embodiment, the channel includes a top portion having a width W in the first direction and two side portions each having a height H less than the width W.

In yet another embodiment, the extended portion of the gate stack is partially embedded in the semiconductor substrate and includes a bottom surface lower than the top surface.

In yet another embodiment, the semiconductor structure further includes a gate spacer formed on sidewalls of the extended portion of the gate stack and vertically contacting the STI feature at the top surface.

In yet another embodiment, the extended portion of the gate stack has a sectional profile that includes a top dimension and a bottom dimension being equal to the top dimension.

In yet another embodiment, the semiconductor substrate includes a first semiconductor material; and the source and drain features are formed in a second semiconductor material that is different from the first semiconductor material and is epitaxy grown on the first semiconductor material.

The present disclosure also provides an embodiment of a method. The method includes forming a shallow trench isolation (STI) feature in a semiconductor substrate, defining an active region on the semiconductor substrate. The STI features and the semiconductor region have a coplanar surface. The method further includes forming a dummy gate on the active region and the STI feature; forming an interlayer dielectric layer (ILD) on the semiconductor substrate; removing the dummy gate, forming a gate trench in the ILD; selectively etching the STI features exposed within the gate trench; and forming a metal gate in the gate trench.

In one embodiment, the method further includes performing a first ion implantation to form light doped drain (LDD) in the active region after the forming of the dummy gate; forming gate spacers on sidewalls of the dummy gate before the forming of the ILD on the semiconductor substrate; and performing a second ion implantation to form heavily doped source and drain aligned with the gate spacers.

In another embodiment, the forming of the ILD includes depositing a dielectric material and performing a first chemical mechanical polishing (CMP) process to the dielectric material layer; and the forming of the metal gate includes depositing a metal layer in the gate trench and performing a second CMP process to the metal layer.

In yet another embodiment, the selectively etching the STI feature exposed within the gate trench includes performing a wet etch process tuned to selectively recess the exposed portion of the STI feature while the semiconductor substrate exposed within the gate trench remains.

In yet another embodiment, the selectively recess includes selectively recess the exposed portion of the STI features by a thickness ranging between 10 nm and about 50 nm.

In yet another embodiment, the forming of the STI feature includes forming the STI feature of a first dielectric material; and the forming of the gate spacers includes forming the gate spacers of a second dielectric material different from the first dielectric material.

In yet another embodiment, the forming of the STI feature includes etching the semiconductor substrate to form a trench; depositing a dielectric material to fill in the trench; and performing a CMP process to planarize the semiconductor substrate such that the semiconductor region and the STI feature have the coplanar top surface.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   forming a feature in a semiconductor substrate, the feature formed of a dielectric material;
   forming a first gate stack over the feature;
   forming an interlayer dielectric layer (ILD) on the semiconductor substrate;
   removing the first gate stack, thereby forming a gate trench in the ILD;
   removing portions of the feature exposed within the gate trench while the semiconductor substrate exposed within the gate trench remains, wherein after the removing of the removing of the portions of the feature, the feature has first and second side portions, wherein the first side portion includes a first portion having a first thickness and a second portion having a second thickness greater than the first thickness;

forming an active region in the semiconductor substrate and surrounded by the first and second side portions of the feature, the first and second side portions of the feature and the active region have coplanar top surfaces, wherein the channel includes two side portions each having a height H less than a width W, the active region has a second top surface and a bottom portion having a width greater than the width W, and the active region has two side portions that are planar and extend from the second top surface to the bottom portion;

forming a second gate stack on the active region, the second gate stack having a portion extended to the first and second side portions of the feature such that the second gate stack physically contacts the first portion and the second portion of the first side portion, wherein the extended portion of the second gate stack is vertically extended below the top surface of the active region;

forming a gate spacer on the second gate stack in a gate width direction and on the first and second side portions of the feature, wherein the gate spacer has a bottom surface in physical contact with the first and second side portions of the feature, wherein the bottom surface is substantially coplanar with the coplanar top surfaces of the active region and the first and second side portions of the feature; and forming a channel in the active region, the channel including a top portion having the width W in a first direction.

2. The method of claim 1, wherein the source and drain features, second gate stack, and the channel are configured to form a field effect transistor.

3. The method of claim 1, wherein the extended portion of the second gate stack is partially embedded in the semiconductor substrate and includes a bottom surface lower than the top surface.

4. The method of claim 1, further comprising:
forming source and drain features in the active region and configured on two opposite sides of the second gate stack, wherein the channel spans between the source and drain features.

5. The method of claim 1, wherein the feature is a shallow trench isolation feature.

6. The method of claim 1, wherein the first gate stack includes a polysilicon gate and the second gate stack includes a metal gate.

7. A method comprising:
forming a shallow trench isolation (STI) feature in a semiconductor substrate;
forming an active region in the semiconductor substrate;
forming an interlayer dielectric layer (ILD) on the semiconductor substrate;
forming a trench through the ILD to expose the active region and the STI feature;
removing a portion of the STI feature exposed within the trench while the semiconductor substrate exposed within the trench remains;
disposing a gate stack on the active region and extended in a first direction to the STI feature, wherein a sidewall spacer is disposed along a sidewall of the gate stack without extending into the STI feature and a gate electrode layer of the gate stack extends into the STI feature;
forming source and drain features in the active region and interposed by the gate stack; and forming a channel in the active region and spanned in a second direction between the source and drain features, the second direction being different from the first direction.

8. The method of claim 7, further comprising forming a gate spacer along a sidewall of the gate stack, the gate spacer having a first bottom surface facing the semiconductor substrate,
wherein a first portion of the gate stack in the active region has a second bottom surface; and
wherein the second bottom surface is substantially coplanar with the first bottom surface.

9. The method of claim 8, wherein a second portion of the gate stack has a third bottom surface being lower than the first bottom surface of the gate spacer.

10. The method of claim 7,
wherein after the removing of the portion of the STI feature, the STI feature has first and second side portions, the first and second side portions each including a first portion in a first region and a second portion in a second region, wherein the first portion is recessed relative to the second portion, wherein the first portion of the first and second side portions of the STI feature has a first thickness and the second portion of the first and second side portions of the STI feature has a second thickness greater than the first thickness,
wherein the channel includes a top portion having a width W in the first direction, two side portions each having a height H less than the width W,
wherein the first portion of each of the first and second side portions of the STI feature has a first top surface,
wherein the second portion of each of the first and second side portions of the STI feature has a second top surface higher than the first top surface,
wherein the active region of the semiconductor substrate has a third top surface being substantially coplanar with the second top surface of each of the first and second side portions of the STI feature, and
wherein the gate stack has a sidewall substantially aligned with an interface between the first portion and the second portion of each of the first and second side portions of the STI feature.

11. The method of claim 10, wherein the sidewall spacer physically contacts the sidewall of the gate stack and is disposed directly on the second portion of each of the first and second side portions of the STI feature; and
wherein the sidewall spacer has a first bottom surface being substantially coplanar with the third top surface,
wherein the active region has a bottom portion having a width greater than the width W;
wherein the active region has two side portions that are planar and extend from the third top surface to the bottom portion.

12. The method of claim 7, wherein disposing the gate stack on the active region and extended in the first direction to the STI feature occurs after removing the portion of the STI feature exposed within the trench while the semiconductor substrate exposed within the trench remains.

13. The method of claim 7, wherein removing the portion of the STI feature exposed within the trench while the semiconductor substrate exposed within the trench remains includes performing an etching process.

14. The method of claim 7, further comprising:
forming a dummy gate on the active region and the STI feature, and wherein the forming of the trench through the ILD to expose the active region and the STI feature includes removing the dummy gate.

15. A method, comprising:

forming a shallow trench isolation (STI) feature in a semiconductor substrate, defining an active region on the semiconductor substrate, wherein the STI feature and the active region have a coplanar surface;

forming a dummy gate on the active region and the STI feature;

forming an interlayer dielectric layer (ILD) on the semiconductor substrate;

removing the dummy gate, thereby forming a gate trench in the ILD;

selectively etching the STI feature exposed within the gate trench, wherein the selectively etching the STI feature exposed within the gate trench includes performing a wet etch process tuned to selectively recess the exposed portion of the STI feature while the semiconductor substrate exposed within the gate trench remains; and forming a metal gate in the gate trench.

16. The method of claim 15, further comprising:

performing a first ion implantation to form a light doped source and drain (LDD) in the active region after the forming of the dummy gate;

forming gate spacers on sidewalls of the dummy gate before the forming of the ILD on the semiconductor substrate; and performing a second ion implantation to form heavily doped source and drain aligned with the gate spacers.

17. The method of claim 16, wherein:

the forming of the ILD includes depositing a dielectric material layer and performing a first chemical mechanical polishing (CMP) process to the dielectric material layer; and the forming of the metal gate includes depositing a metal layer in the gate trench and performing a second CMP process to the metal layer.

18. The method of claim 16, wherein:

the forming of the STI feature includes forming the STI feature of a first dielectric material; and the forming of the gate spacers includes forming the gate spacers of a second dielectric material different from the first dielectric material.

19. The method of claim 15, wherein the selectively recess includes selectively recessing the exposed portion of the STI features by a thickness ranging between 10 nm and about 50 nm.

20. The method of claim 15, wherein the forming of the STI feature includes:

etching the semiconductor substrate to form a trench;

depositing a dielectric material to fill in the trench; and performing a CMP process to planarize the semiconductor substrate such that the semiconductor substrate and the STI feature have the coplanar top surface.

* * * * *